United States Patent [19]

Hepler

[11] Patent Number: 5,432,801
[45] Date of Patent: Jul. 11, 1995

[54] METHOD AND APPARATUS FOR PERFORMING MULTIPLE SIMULTANEOUS ERROR DETECTION ON DATA HAVING UNKNOWN FORMAT

[75] Inventor: Edward Hepler, Malvern, Pa.

[73] Assignee: Commodore Electronics Limited, West Chester, Pa.

[21] Appl. No.: 96,322

[22] Filed: Jul. 23, 1993

[51] Int. Cl.⁶ .................................... H03M 13/00
[52] U.S. Cl. ................................. 371/40.1; 371/48
[58] Field of Search .................... 371/37.1–42, 371/21, 48; 360/47, 51, 53, 32, 48; 369/48, 49, 59, 53

[56] References Cited

U.S. PATENT DOCUMENTS

| | | |
|---|---|---|
| 3,439,331 | 4/1969 | Brown et al. . |
| 3,452,328 | 6/1969 | Hsiao et al. . |
| 3,622,985 | 11/1971 | Ayling et al. . |
| 3,851,306 | 11/1974 | Patel . |
| 4,052,698 | 10/1977 | Ragle . |
| 4,348,761 | 9/1982 | Berger ........................ 371/21 |
| 4,379,286 | 4/1983 | Yokota et al. ............. 371/37 |
| 4,454,600 | 6/1984 | LeGresley . |
| 4,593,393 | 6/1986 | Mead et al. . |
| 4,649,541 | 3/1987 | Lahmeyer ................... 371/37 |
| 4,740,938 | 6/1988 | Bierhoff et al. . |
| 4,791,641 | 12/1988 | Hillis . |
| 4,882,731 | 11/1989 | van Gils . |
| 4,914,523 | 4/1990 | Maruta . |
| 4,937,828 | 6/1990 | Shih et al. . |
| 4,998,252 | 3/1991 | Suzuki et al. . |
| 5,027,357 | 6/1991 | Yu et al. . |
| 5,051,999 | 9/1991 | Erhart et al. . |
| 5,172,381 | 12/1992 | Karp et al. ................. 371/42 |
| 5,206,851 | 4/1993 | Cho .......................... 371/37.5 |
| 5,289,471 | 2/1994 | Tanaka et al. ............. 371/37.7 |

OTHER PUBLICATIONS

P. A. Beaven, "Parallel Programmable Array-Structured CRC Generator", *IBM Technical Disclosure Bulletin*, vol. 21, No. 5, pp. 2058–2059 (Oct. 1978).

P. E. Boudreau et al., "Parallel CRC Generation For Multilength Characters", *IBM Technical Disclosure Bulletin*, vol. 15, No. 4, pp. 1314–1315 (Sep. 1972).

"8-Bit Parallel CRC Generator/Checker Using Field Programmable Logic", *Design Ideas* date unknown.

Primary Examiner—James P. Trammell
Attorney, Agent, or Firm—Ratner & Prestia

[57] ABSTRACT

An error may be detected and corrected from among a plurality of data values retrieved from a compact disk-read only memory (CD-ROM). As a stream of data values which have been retrieved from the CD-ROM are retransmitted by an appropriate DMA device, two different error detection schemes are simultaneously applied to identical copies of the retrieved data. The retrieved data is then evaluated to determine in which format data has been stored on the CD-ROM. A condition value which has been generated by the algorithm corresponding to the determined format of data on the CD-ROM is then evaluated to determine the probability of an error condition in the retrieved data. The two error detection schemes may differ solely in the location of the data values which are evaluated for errors.

5 Claims, 4 Drawing Sheets

| SYNC | HEADER | USER DATA | EDC | BLANK | ECC | ½ | CTRL |

FIG. I(a)

| SYNC | HEADER | SUB HEADER | USER DATA | EDC | ECC | ½ | CTRL |

FIG. I(b)

METHOD AND APPARATUS FOR PERFORMING MULTIPLE SIMULTANEOUS ERROR DETECTION ON DATA HAVING UNKNOWN FORMAT

FIELD OF THE INVENTION

The present invention relates to apparatus and a method for recovering data from a compact digital disk and more specifically to error detection techniques associated with compact digital disks. In particular, a method and apparatus are disclosed for facilitating error checking of data which is read from a compact digital disk.

BACKGROUND OF THE INVENTION

Systems known as Compact Disk-Read Only Memories (CD-ROM) are now well known. Such systems employ an optical-type digital disk on which a relatively large volume of information (typically in excess of 600 megabytes) may be stored.

When a disk is manufactured, it is typically optically and electronically checked to ensure that all of the data recorded on the disk can be recovered without error. However, when a disk is being played back, errors may occur. These errors may be due to, for example, dirt or scratches on the disk or irregularities in the disk's polycarbonate layer.

In order to detect and correct errors, various error detection/correction schemes have been proposed. For audio applications, Cross-interleaved Reed Solomon Code (CIRC) may be used. For CD-ROM applications, a layered error detection code/error correction code (EDC/ECC) is added to the CIRC. Although this augmented code does not correct as many errors as other types of codes, it allows for the correction of a sufficient number of errors to be useful in a CD-ROM environment. The use of both CIRC and EDC/ECC (both known also as cyclical redundancy code) are well known in the art and are described in numerous publicly available references including U.S. Pat. No. 4,937,828 to Shih et al. and U.S. Pat. No. 4,998,252 to Suzuki et al., both of which are incorporated herein by reference.

As is well known in the art, data is organized on a compact disk as a plurality of sectors. Each sector is divided into several fields, each of which serves a particular purpose.

FIG. 1A and FIG. 1B illustrate two formats for physical sectors which are commonly used in CD-ROM applications. The sector formatting shown in FIG. 1A is referred to as Yellow Book (or mode 1, type 2) format. As shown, this format provides 12 bytes of data to be used for synchronization, 4 bytes of header data, 2,048 bytes of user data, 4 bytes of EDC data, 8 blank bytes, 276 bytes of ECC data, an EDC/ECC designation field and a control field. FIG. 1B illustrates what is referred to as compact disk interactive (CD-I) (or mode 2, type 1) format. As is shown, this format provides 12 bytes of data for synchronization, 1 byte of header data, 8 bytes of subheader data, 2,048 bytes of user data, 4 bytes of EDC data, 276 bytes for ECC, 1 byte for EDC/ECC designation and 1 control byte. Yellow book and CD-I are two well known sector layouts for CD formats. However, one skilled in the art will recognize that there are numerous other ways in which sectors can be formatted. Several additional formats are already known. Other additional formats may be created at some time in the future.

As is well known, error detection and error correction are accomplished by EDC/ECC by performing appropriate algorithms on particular data bits and error detection bits in order to determine if an error has occurred. These algorithms assume that bits (and bytes) have been stored on a data medium in a particular format. Thus, for ECC/EDC to be performed properly, data bits, correction bits, and detection bits must all be in preassigned and predetermined locations. Put another way, an error detection algorithm is desirably used which corresponds to the format of the sector being read. If an algorithm for one type of sector format is used in conjunction with data stored in another type of sector format, incorrect results may be obtained.

SUMMARY OF THE INVENTION

The present invention relates to a method and apparatus for detecting errors in data values retrieved from a CD-ROM. The data values may be stored on the CD-ROM in one of several formats. The method comprises the steps of reading values from the CD-ROM, and simultaneously executing, on the read values, a first error detection algorithm corresponding to a first sector format and a second error detection algorithm corresponding to a second sector format. The results of execution of each of these algorithms are stored. A determination is then made as to the actual sector format of the sector of data values that were read. The results of the algorithm appropriate for the determined sector format are then evaluated. As a result of this evaluation, it is determined whether errors exist in the retrieved values.

BRIEF DESCRIPTION OF THE DRAWINGS

FIG. 1A is a sector layout for Yellow Book (mode 1, type 2) CD format.

FIG. 1B is a sector layout for CD-I (mode 2, type 1) CD format.

DETAILED DESCRIPTION OF THE PRESENT INVENTION

Figure 2:
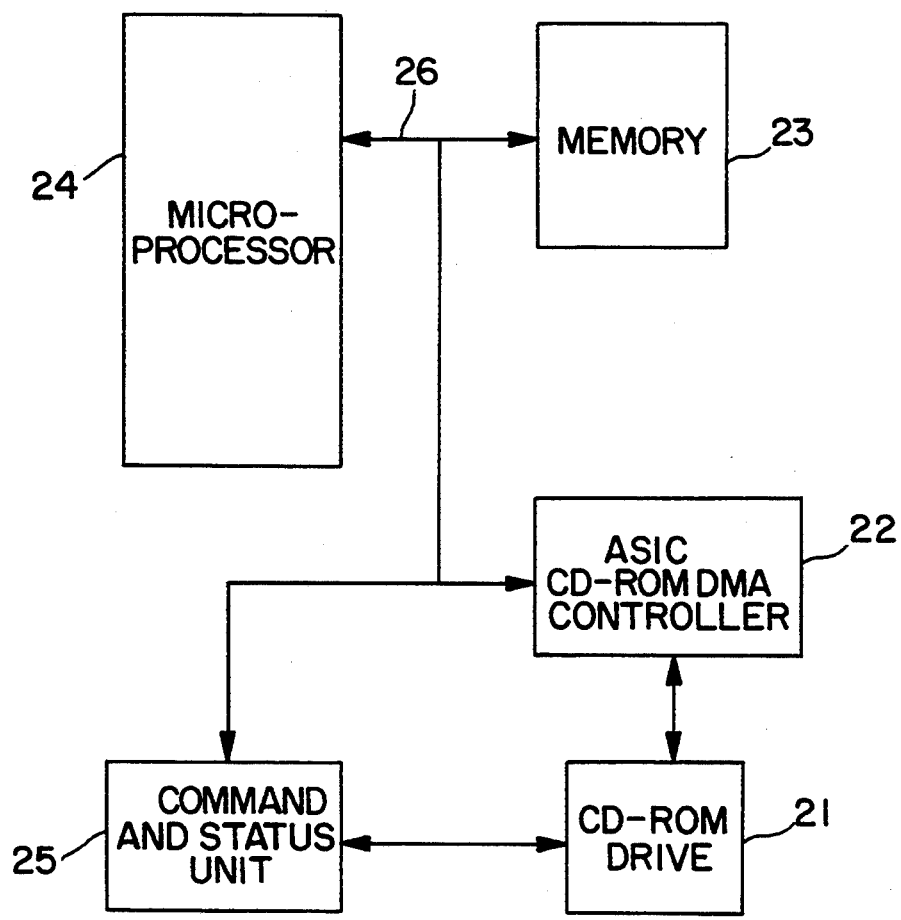
FIG. 2 is a block diagram of circuitry suitable for implementing an exemplary embodiment of the present invention.

FIG. 2 provides a block diagram suitable for implementing an exemplary embodiment of the present invention. CD-ROM drive 21 may be a CD-ROM drive which is well known in the art and which includes a variety of components (not shown) that are used to read data off of a CD-ROM. These components include a motor, an optical transducer, appropriate servos, control circuitry and circuitry which translates the electrical signals produced by the optical transducer into digital data. An exemplary configuration of these components is set forth in U.S. Pat. No. 4,998,252 to Suzuki et al. However, as is readily understood to one skilled in the art, other configurations are readily possible.

CD-ROM drive 21 receives instructions from command and status unit (CSU) 25. Furthermore, CD-ROM drive 21 transmits appropriate status and subchannel output signals to CSU 25. CSU 25 issues commands to CD-ROM drive 21 based upon commands received by CSU 25 from microprocessor 24. Microprocessor 24 is capable of issuing commands responsive to the status signals which are received by CSU 25 from CD-ROM 21 and which, in turn, are transmitted to microprocessor 24. Data which is retrieved from CD-ROM drive 21 is transmitted via an application specific integrated circuit (ASIC) 22 to memory 23. ASIC 22 may include a CD-ROM direct memory access (DMA) controller in which appropriate circuitry is included for performing error detection algorithms. All data transferred among the microprocessor 24, memory 23, CSU 25 and ASIC 22 is conveyed by a system bus 26. In the exemplary embodiment of the invention, this is a 32-bit bus which conveys data and addresses among the various system components.

Figure 3:
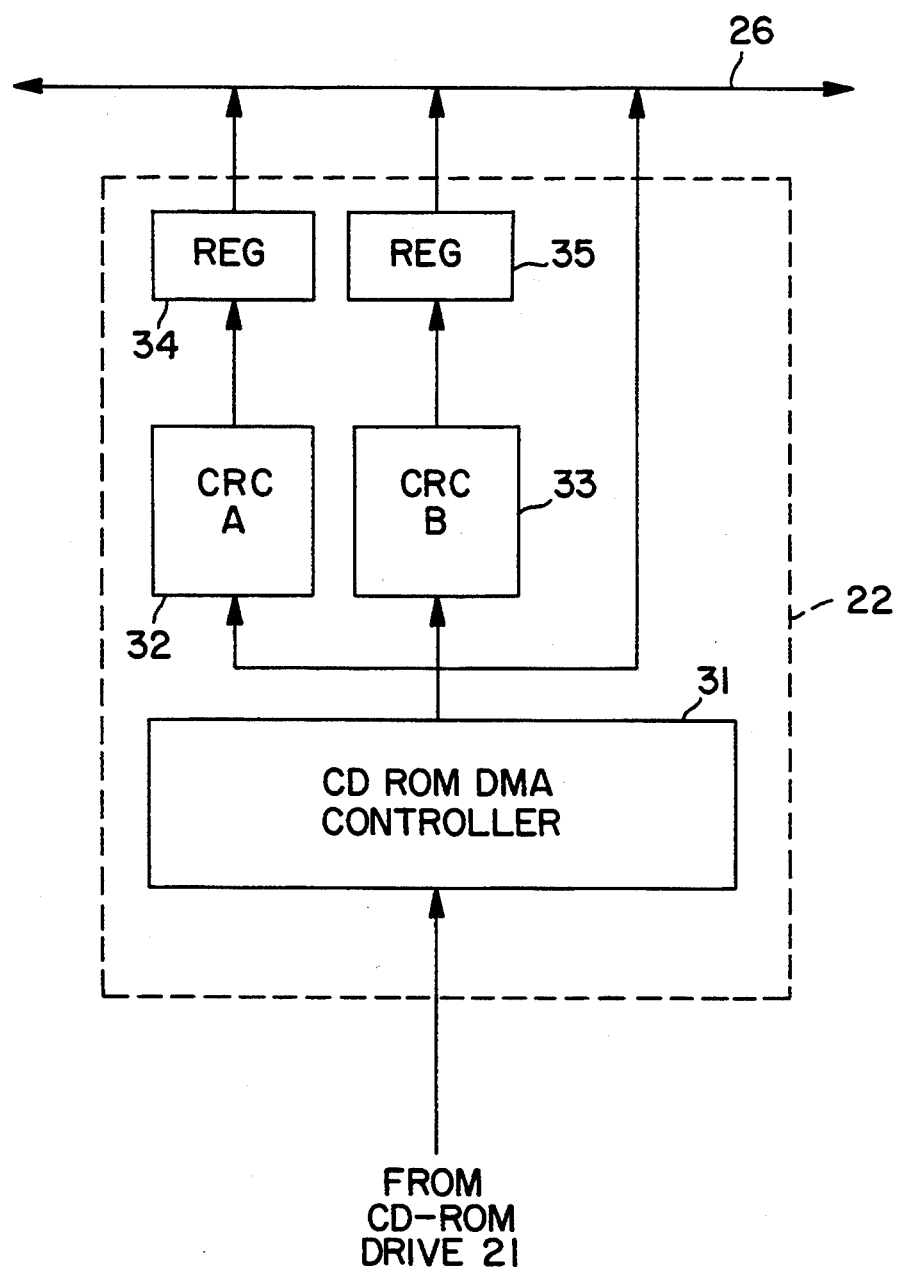
FIG. 3 is a block diagram of a CD-ROM DMA controller suitable for use with the exemplary embodiment of the present invention shown in FIG. 2.

A more detailed illustration of ASIC 22 is provided in FIG. 3. The ASIC 22 shown in FIG. 3 includes a CD-ROM Direct Memory Access controller 31, an A-CRC processor 32, a B-CRC processor 33, and two registers 34 and 35. As a sector of data is received from CD-ROM drive 21, it is transmitted through CD-ROM DMA controller 31. From CD-ROM DMA controller 31, the data is simultaneously transmitted to several places. First, the data is transmitted to a sector memory buffer (not shown) in memory 23 (shown in FIG. 2). Second, the data is transmitted to the A-CRC processor 32. Third, the data is transmitted to the B-CRC processor 33. A-CRC processor 32 and B-CRC processor 33 each implements a respective algorithm for performing error detection. In an exemplary embodiment of the present invention, A-CRC processor 32 and B-CRC processor 33 each implement an identical cyclical redundancy code (CRC) algorithm. Each of these processors, however, applies the CRC algorithm to a respectively different subset of the sector data returned from the CD-ROM drive. The A-CRC processor 32 may implement an error detection algorithm suitable for use with Yellow Book (mode 1, type 2)CD sector format while the B-CRC processor 33 implements an algorithm suitable for error detection in conjunction with CD-I (mode 2, type 1) CD sector format.

An alternative method for processing the data retrieved from the CD-ROM device would be to store the data sector, determine the data type of the sector and then apply the proper CRC code to determine if the sector contains errors. Because the exemplary apparatus according to the present invention performs the two CRC checks concurrently, it does not need to store the data sector and, so, represents a significant cost saving over the described alternative method.

As shown in FIG. 3, a register 34 and a register 35 are also provided. Register 34 is coupled to hold the result produced by the A-CRC processor 32. Register 35 is coupled to hold the result produced by the B-CRC processor 33.

When the A-CRC processor 32 completes its processing it produces a syndrome value which is stored in register 34. If the data sector provided by the CD-ROM drive 21 is a mode-1 type-2 sector, this syndrome value is indicative of the correctness of the received data. For example, a zero value may indicate that the data which has been received has a high probability of being correct. Conversely, a non-zero syndrome value may indicate that the data which has been received contains an error. Consequently, the stored syndrome may be only a single bit which is set to indicate that the data may have errors.

Similarly, when the B-CRC processor 33 completes its processing, a syndrome value is stored in register 35 which is indicative of the correctness of the data in the received sector, if that sector is a mode-2 type-1 sector. For example, a zero value may be stored to indicate that the data which has been received has a high probability of being correct. Conversely, a non-zero value may be stored to indicate that the data which has been received contains an error.

In this way, the data which has been transmitted to memory 23 by CD-ROM DMA controller 31 has been simultaneously checked based on two distinct error detection algorithms.

Although A-CRC processor 32 and B-CRC processor 33 have each been described as implementing respective "algorithms" as is well known in the art, each of these algorithms may simply consist of passing the data through circuitry which processes the data according to an appropriate polynomial. After the data stored on the CD-ROM have been passed through the polynomial, the result of this action is the syndrome value which stored in register 34 and register 35 as set forth above.

In an exemplary embodiment of the present invention, A-CRC processor 32 and B-CRC processor 33 each implement a respective algorithm based on an identical polynomial (e.g. $x^{16}+x^{15}+x^2+1$). One of ordinary skill in the art of processing CRC encoded data can readily design circuitry suitable for generating the CRC code based on this polynomial. Exemplary circuitry, for example, is shown in U.S. Pat. No. 5,027,357 entitled ECC/CRC ERROR DETECTION AND CORRECTION SYSTEM which is hereby incorporated by reference for its teachings on CRC error detection circuitry.

In the exemplary embodiment of the invention, the operation of A-CRC processor 32 and B-CRC processor 33 differ in that each assumes a respectively different sector format. In other words, the location of data fields in the sector format which is assumed by A-CRC processor 32 differs from the location of data fields in the sector format which is assumed by B-CRC processor 33.

For example, A-CRC processor 32 may assume that the data is in Yellow Book format and exclude the header information from the CRC check while B-CRC processor 33 may assume that the data is in CD-I format and include the header data. Thus, assuming that the data is free of errors, one CRC processor (i.e. one of A-CRC processor 32 and B-CRC processor 33) will indicate a zero value in its respective register (register 34 for A-CRC processor 32 and register 35 for B-CRC processor 33) if that data is in the respective format for the algorithm implemented by that particular CRC processor. The other CRC processor (i.e. the other of A-CRC processor 32 and B-CRC processor 33) will store a non-zero data value in its respective register because the received data will not be in the proper format for the processor. In this manner, two different error detection values corresponding to two respective sector formats are generated for a particular sector before the format of the sector is known.

After the syndrome value corresponding to two formats has been determined for a particular sector, the sector can then be evaluated by microprocessor 24 (or some other processor) in order to determine the actual format in which data has been stored in that sector. After the format in which the data has been stored is determined, the register corresponding to the determined format (i.e. register 34 or register 35) can be evaluated. If the register corresponding to the determined CRC format has a zero value, then there is a high probability that the data which has been read from the CD-ROM is correct.

If, however, the register corresponding to the determined CRC format has a non-zero value, then there is an error in the data. The error correction algorithm particular to the determined format can then be executed on the data which has been read from the disk. Exemplary error correction algorithms, in addition to those well known in the art, are disclosed in the U.S. patents set forth above. The data value in the remaining register (i.e. the register associated with CRC processor which does not execute the algorithm appropriate for the actual format of the read sector) is simply discarded.

Figure 4:
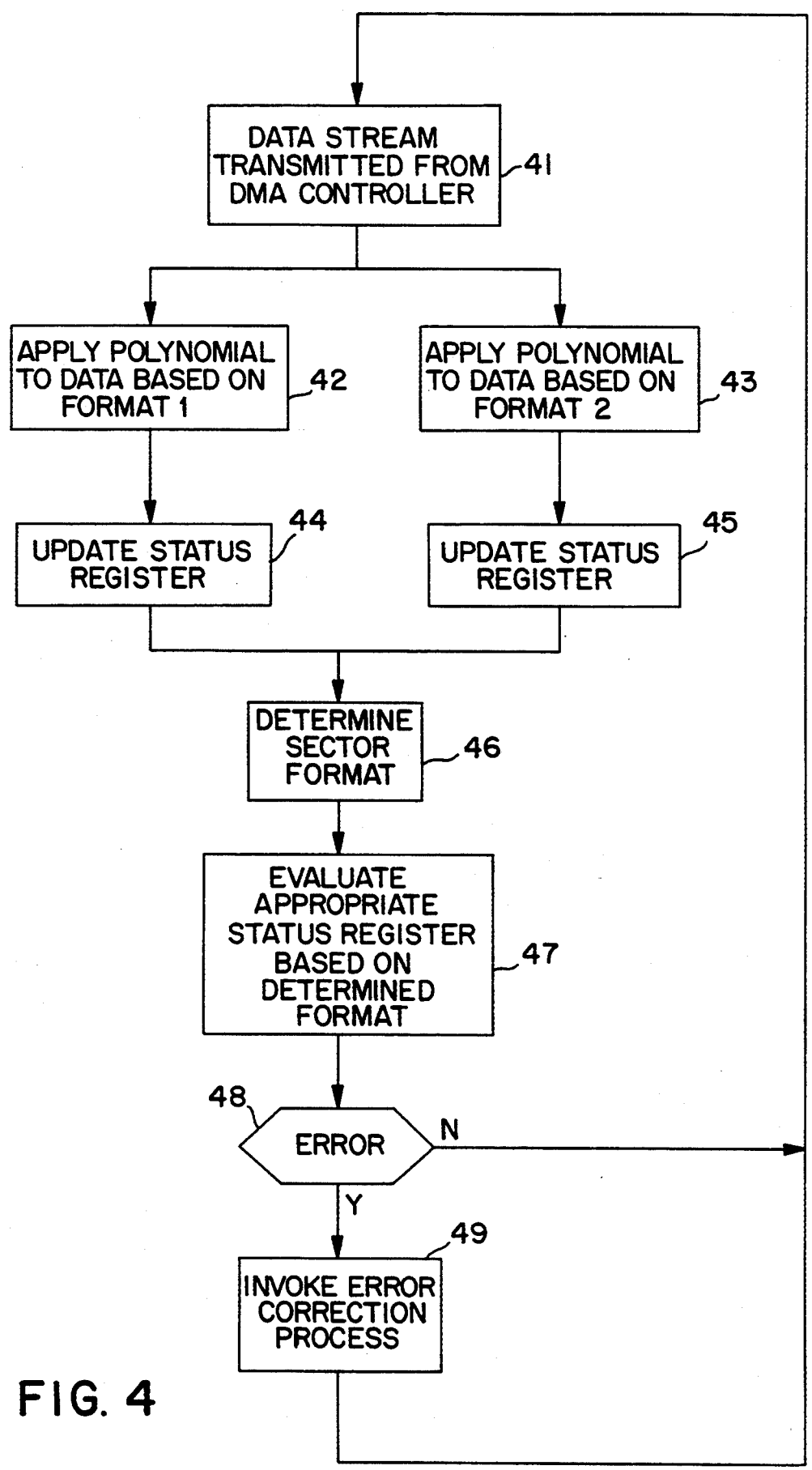
FIG. 4 is a flow chart diagram which is useful for describing the operation of the exemplary embodiment of the present invention shown in FIG. 2.

Operation of the exemplary embodiment of the present invention is illustrated by the flow chart diagram in FIG. 4.

At step 41, the data stream is transmitted by CD-ROM DMA controller 31. This data is passed through an appropriate error detection polynomial based on a first sector format at step 42. This data is simultaneously passed through a polynomial based on a second sector format at step 43. The results of steps 42 and 43 are each stored in a respective register at steps 44 and 45, respectively. Then, at step 46, a determination is made (as set forth previously) as to the actual format in which the data on the CD-ROM is stored. At step 47, the value stored in the appropriate register (i.e. stored at either step 44 or step 45) is evaluated based on the determined format of the data on the CD-ROM. If the appropriate status register indicates that an error has occurred, then, from step 48, control transfers to step 49 which invokes an error correction routine for the erroneous data. After step 49 and if no error is detected at step 48, control returns to step 41 to obtain the next sector from the CD-ROM.

While the invention has been described above with regard to cyclical redundancy codes, it is readily apparent that other types of error detection and/or error correction schemes may be used. While the invention has been described in terms of a CD-ROM device, it is readily apparent that it may be practiced with other types of data that may be encoded according to an error detection and/or an error correction scheme, such as data packets received from a network and data stored on other mass-storage media, such as tape or disk.

While the invention has been described in terms of an exemplary embodiment, it is contemplated that it may be practiced as outlined above with modifications within the spirit and scope of the appended claims.

The invention claimed is:

1. A method of detecting an error in at least one of a plurality of received data values, wherein a first error detection coding scheme detects said error if said plurality of received data values are in a first data format and a second error detection coding scheme detects said error if said plurality of received data values are in a second data format, said method comprising the steps of:
    a) receiving said plurality of data values;
    b) performing a first error detection check, corresponding to the first error detection coding scheme, on said plurality of data values to produce a first syndrome value;
    c) storing the first syndrome value;
    d) simultaneously with step b) performing a second error detection check, corresponding to the second error detection coding scheme, on said plurality of data values to produce a second syndrome value;
    e) storing the second syndrome value;
    f) classifying said plurality of data values as being in one of said first data format and said second data format;
    g) if said plurality of data values are classified as being in said first data format then determining if said plurality of data values have said error based on said first syndrome value; and
    h) if said plurality of data values are classified as being in said second data format then determining if said plurality of data values have said error based on said second syndrome value.

2. A method of detecting an error according to claim 1, wherein in step a) said plurality of data values are received from a network.

3. A method of detecting an error according to claim 1, wherein in step a) said plurality of data values are respective sectors of data values received from a CD-ROM.

4. A method of detecting an error according to claim 3, wherein the first and second error detection schemes use identical cylic redundancy polynomials applied to respectively different subsets of the data values in the respective sectors.

5. A method of detecting an error according to claim 3, wherein said first data format is Yellow Book format and the second data format is compact disk interactive (CD-I) format.

* * * * *